(12) United States Patent
Wu

(10) Patent No.: US 10,551,413 B2
(45) Date of Patent: Feb. 4, 2020

(54) PRECISE ASSEMBLY MECHANISM

(71) Applicant: INNOSERV, INC., Taichung (TW)

(72) Inventor: Chih-Meng Wu, Miaoli County (TW)

(73) Assignee: INNOSERV, INC., Taichung (TW)

( * ) Notice: Subject to any disclaimer, the term of this patent is extended or adjusted under 35 U.S.C. 154(b) by 299 days.

(21) Appl. No.: 15/791,355

(22) Filed: Oct. 23, 2017

(65) Prior Publication Data

US 2019/0096718 A1 Mar. 28, 2019

(51) Int. Cl.
| | | |
|---|---|---|
| *G01R 3/00* | (2006.01) | |
| *H01R 43/20* | (2006.01) | |
| *G01R 1/073* | (2006.01) | |
| *H05K 3/00* | (2006.01) | |

(52) U.S. Cl.
CPC ........... *G01R 3/00* (2013.01); *G01R 1/07307* (2013.01); *H01R 43/20* (2013.01); *H05K 3/00* (2013.01); *H01R 2201/20* (2013.01)

(58) Field of Classification Search
CPC .. H01R 43/20; H01R 43/205; H01R 2201/20; G01R 3/00; G01R 1/07314; G01R 1/06705; G01R 1/07307; G01R 1/07357; G01R 1/07371
See application file for complete search history.

(56) References Cited

U.S. PATENT DOCUMENTS

| | | | | |
|---|---|---|---|---|
| 5,083,863 A | * | 1/1992 | Cerda | G01R 31/04 250/223 R |
| 5,727,312 A | * | 3/1998 | Maejima | H01R 43/20 29/33 M |
| 5,989,994 A | * | 11/1999 | Khoury | H01L 24/13 257/775 |
| 8,199,320 B2 | * | 6/2012 | Takahashi | H05K 3/308 356/237.1 |
| 2004/0124507 A1 | * | 7/2004 | Aldaz | G01R 1/07314 257/668 |
| 2011/0006796 A1 | * | 1/2011 | Kister | G01R 1/07314 324/756.01 |

* cited by examiner

*Primary Examiner* — Livius R. Cazan

(57) ABSTRACT

A precise assembly mechanism contains: a control unit controlling a clamp unit, a loading unit, and a visual sensing unit to operate. The clamp unit includes a clamper and moves in a third direction Z, the loading unit includes a slider moving in a first direction X or a second direction Y, the holding tray moves in the first direction X or the second direction Y. The visual sensing unit includes a first sensor for identifying a position of an upper rim of each of at least one through orifice on a holding tray, a second sensor for identifying positions of a lower rim of each through orifice and a tip of each of multiple materials, a third sensor for determining a profile of each material in the second direction Y, and a fourth sensor configured to judge the profile of each material in the first direction X.

9 Claims, 6 Drawing Sheets

PRECISE ASSEMBLY MECHANISM

FIELD OF THE INVENTION

The present invention relates to automatic insertion equipment, and more particularly to a precise assembly mechanism which inserts each material into each through orifice of a holding tray quickly and reduces fabrication cost.

BACKGROUND OF THE INVENTION

Wafer testing and packaging is a back-end process of manufacture semiconductor, wherein the wafer testing is applied to test a probe of a die of a chip, for example, a test head includes the probe fixed thereon and made of gold wire, hence the probe contacts with the pad of the die so as to test electrical characteristics of the die and eliminate unqualified die.

A size of the probe of the wafer is reduced to 24.5 µm from 150 µm, so the probe is assembled difficultly.

In addition, it takes long time to assemble the probe onto a holding tray, thus increasing production cost.

The present invention has arisen to mitigate and/or obviate the afore-described disadvantages.

SUMMARY OF THE INVENTION

The primary aspect of the present invention is to provide a precise assembly mechanism which adjusts the position of each through orifice of the holding tray, judges the profile of each material, and aligns the tip of each material with the each through orifice by using the visual sensing unit.

Further aspect of the present invention is to provide a precise assembly mechanism which inserts each material into each through orifice of the holding tray quickly and reduces fabrication cost.

Another aspect of the present invention is to provide a precise assembly mechanism in which the first motor and the second motor of the clamp unit drive the pick module to adjust the profile of each material, thus inserting each material into each through orifice exactly.

To obtain the above aspects, a precise assembly mechanism provided by the present invention is applied to assemble multiple materials onto a holding tray having at least one through orifice, and the precise assembly mechanism contains: a control unit controlling a clamp unit, a loading unit, and a visual sensing unit to operate.

The clamp unit includes a clamper configured to clamp the multiple materials and moving in a third direction Z.

The loading unit is located below the clamp unit and includes a slider moving in a first direction X or a second direction Y perpendicular to the first direction X, the holding tray is mounted on the slider so as to be controlled by the slider to move in the first direction X or the second direction Y.

The visual sensing unit includes multiple sensors, wherein a first sensor is configured to identify a position of an upper rim of each of the at least one through orifice of the holding tray, a second sensor is configured to identify positions of a lower rim of each through orifice and a tip of each of the multiple materials, a third sensor is configured to determine a profile of each material in the second direction Y, and a fourth sensor is configured to judge the profile of each material in the first direction X.

When the first sensor and the second sensor respectively confirm positions of the upper rim and the lower rim of each through orifice, the third sensor and the fourth sensor confirm the profile of each material is at a set value, and the second sensor confirms the position of the tip of each material is correct, the clamper inserts each material into each through orifice of the holding tray.

DETAILED DESCRIPTION OF THE PREFERRED EMBODIMENTS

Figure 1:
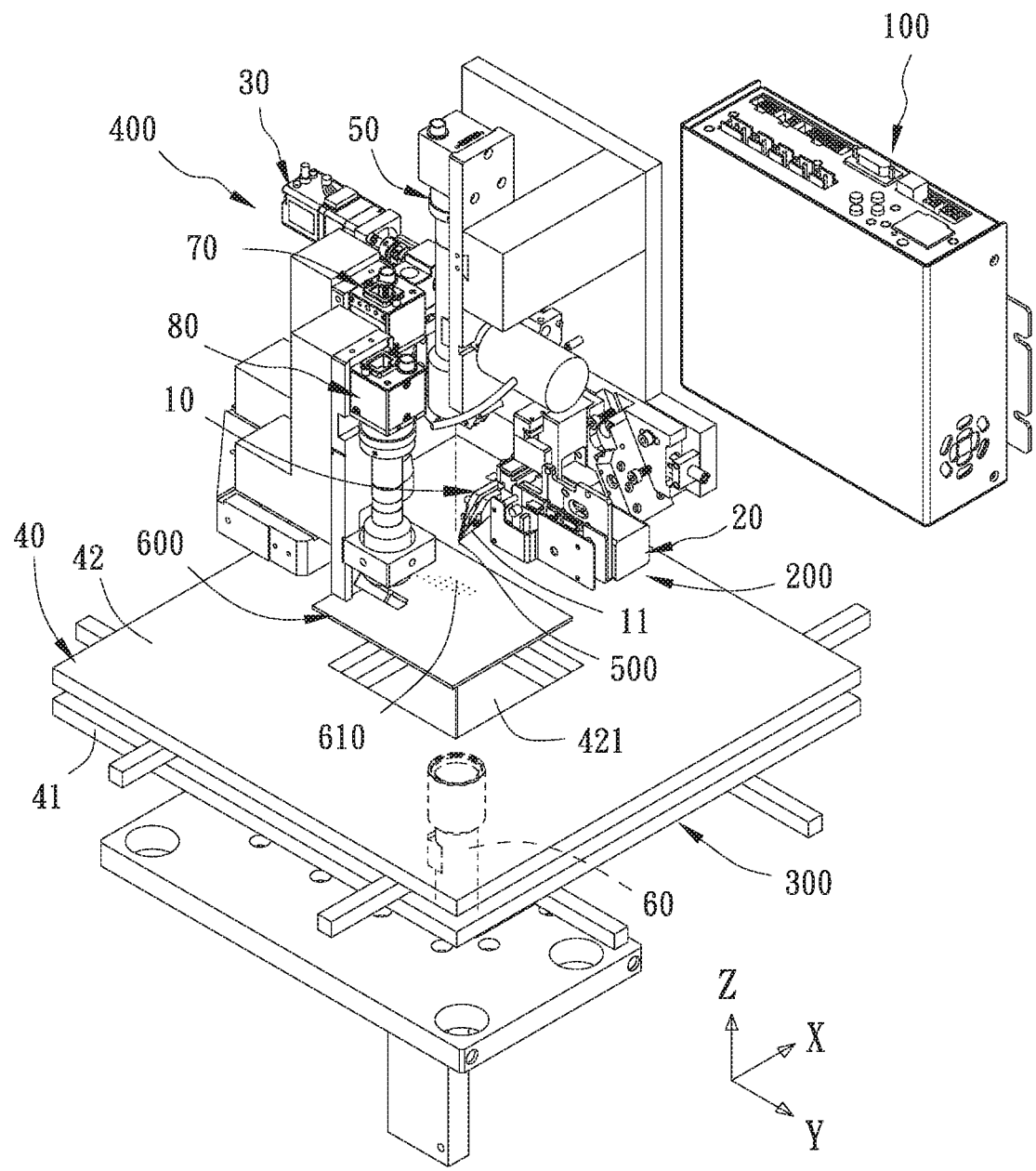
FIG. 1 is a perspective view showing the assembly of a precise assembly mechanism according to a preferred embodiment of the present invention.

With reference to FIG. 1, a precise assembly mechanism according to a preferred embodiment of the present invention comprises: a control unit 100, a clamp unit 200, a loading unit 300, and a visual sensing unit 400. The precise assembly mechanism is applied to assemble multiple materials 500 onto a holding tray 600, wherein the control unit 100, the clamp unit 200, the loading unit 300, and the visual sensing unit 400 are mounted on a machine which is a well-known art, so further remarks are omitted.

The control unit 100 controls the clamp unit 200, the loading unit 300, and the visual sensing unit 400 to operate.

Figure 2:
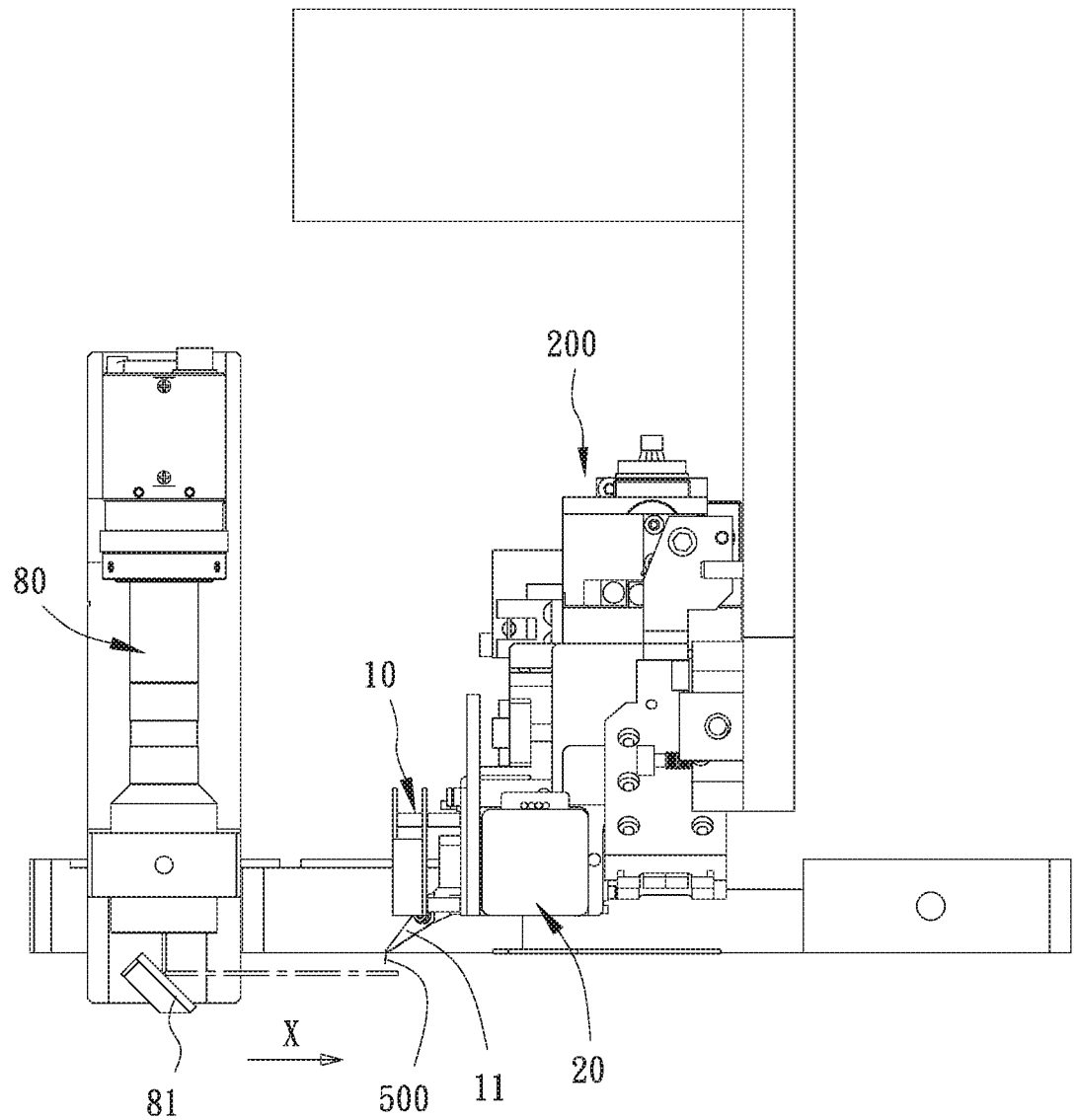
FIG. 2 is a side plan view showing the assembly of a clamp unit and a fourth sensor of the precise assembly mechanism according to the preferred embodiment of the present invention.
Figure 3:
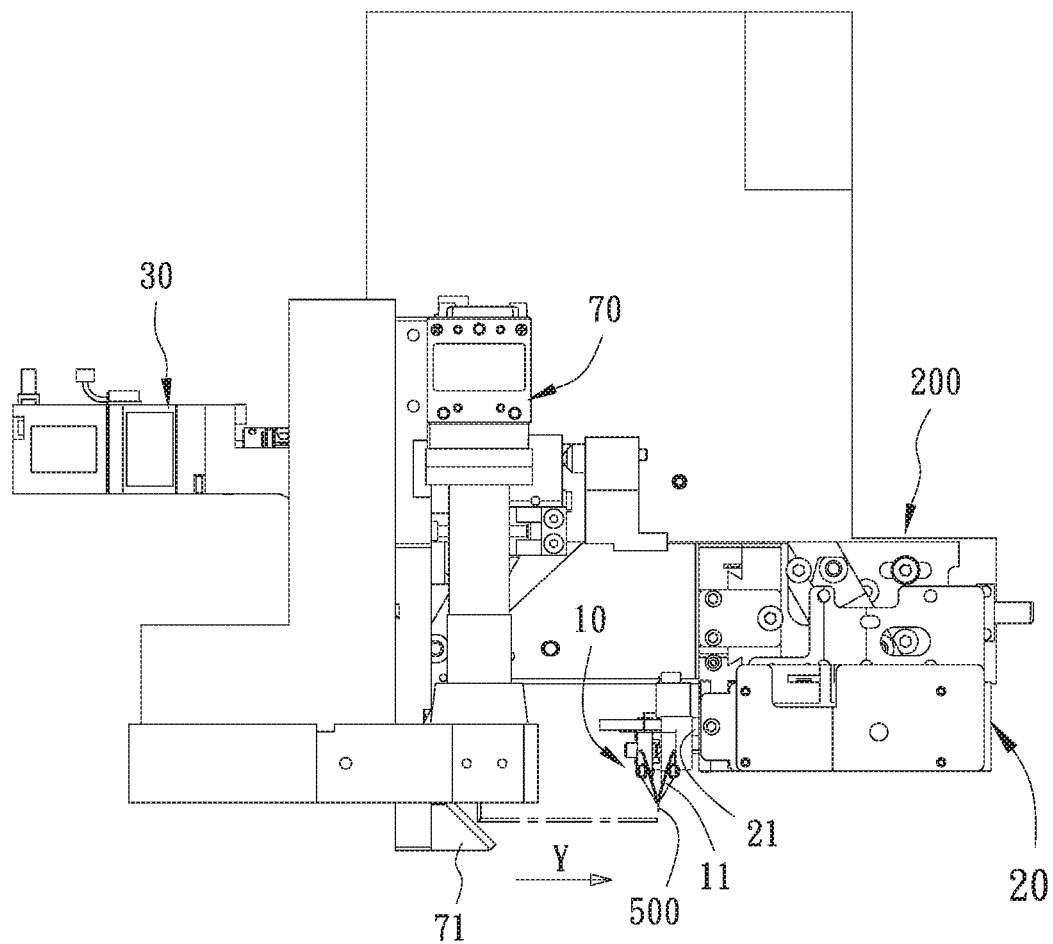
FIG. 3 is a side plan view showing the assembly of a clamp unit and a third sensor of the precise assembly mechanism according to the preferred embodiment of the present invention.
Figure 4:
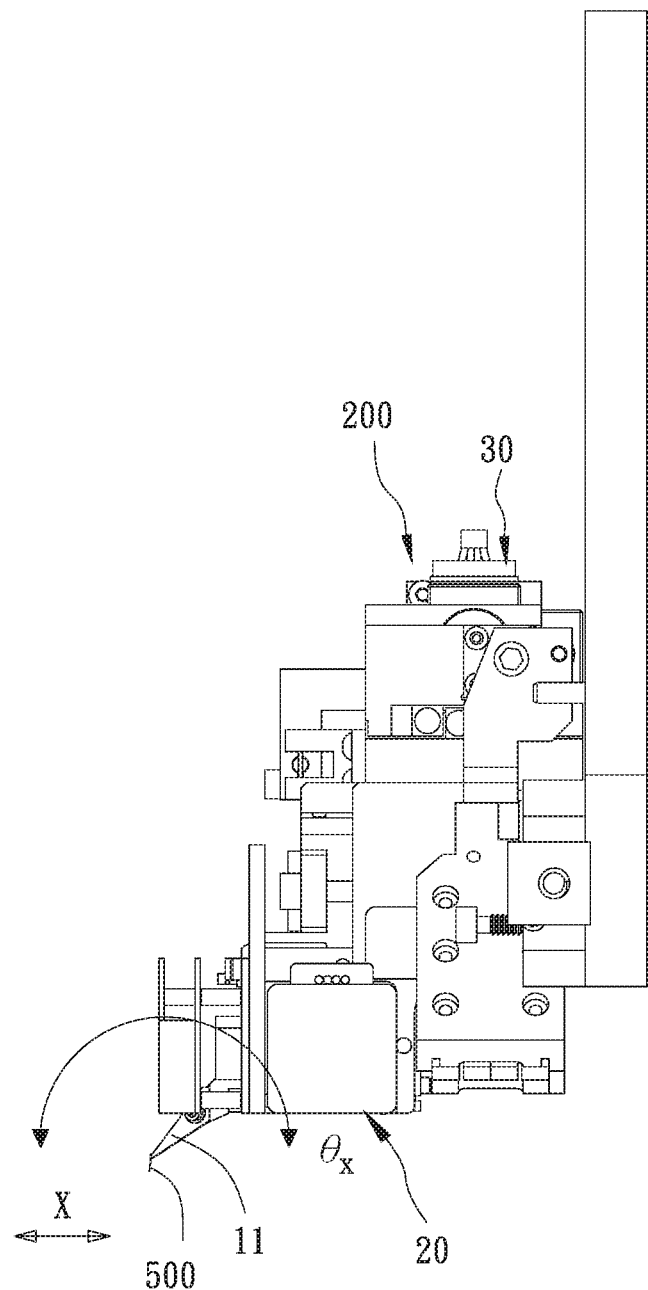
FIG. 4 is a side plan view showing the assembly of the clamp unit of the precise assembly mechanism according to the preferred embodiment of the present invention.
Figure 5:
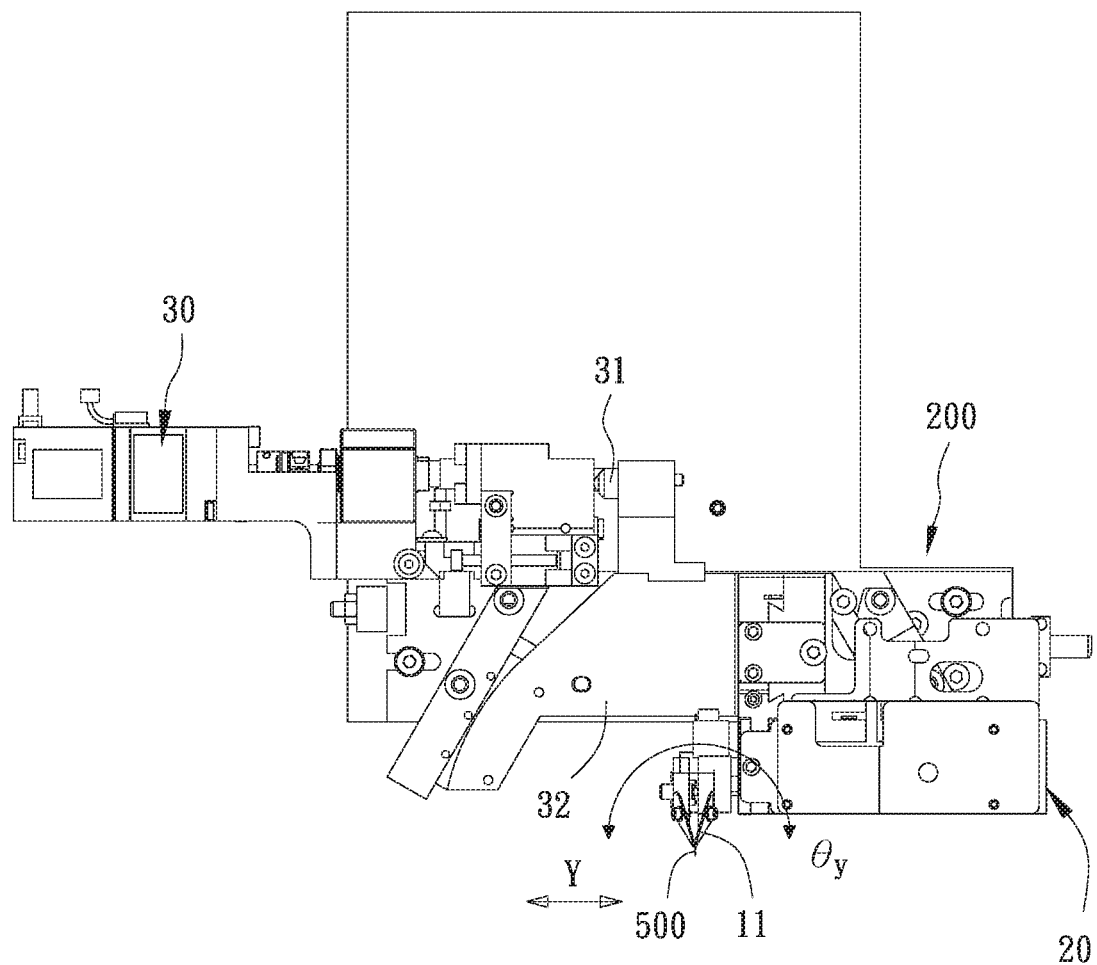
FIG. 5 is another side plan view showing the assembly of the clamp unit of the precise assembly mechanism according to the preferred embodiment of the present invention.

Referring further to FIGS. 2 and 3, the clamp unit 200 includes a pick module 10, a first motor 20, and a second motor 30, wherein the pick module 10 has a clamper 11 configured to clamp the multiple materials 500 and moving in a third direction Z, the first motor 20 is fixed on a first side of the pick module 10 and controls the clamper 11 and each of the multiple materials 500 to rotate in a first direction X, and the second motor 30 is secured on a second side of the pick module 10 and controls the clamper 11 and each material 500 to rotate in a second direction Y, wherein the first direction X is perpendicular to the second direction Y. The first motor 20 has a first central shaft 21 axially connected on the second side of the pick module 10 so as to control the clamper 11 and each material 500 to rotate a first angle $\theta_x$ in the first direction X (as shown in FIG. 4). The second motor 30 has a second central shaft 31 axially connected on a drive member 32 which is in connection with the pick module 10 so as to control the clamper 11 and each material 500 to rotate a second angle $\theta_y$ in the second direction Y (as illustrated in FIG. 5). In this embodiment, each of the first motor 20 and the second motor 30 is a servo motor or a stepper motor.

The loading unit 300 is located below the clamp unit 200 and includes a slider 40 moving in the first direction X or the second direction Y. The holding tray 600 is mounted on the slider 40 so as to be controlled by the slider 40 to move in the first direction X or the second direction Y, as shown in FIGS. 1-6, and the holding tray 600 includes at least one through orifice 610. The slider 40 has a rail set 41 and a platform 42 arranged on the rail set 41, and the platform 42 has an opening 421 defined on a central position thereof, wherein the holding tray 600 is located above the opening 421 of the platform 42.

Figure 6:
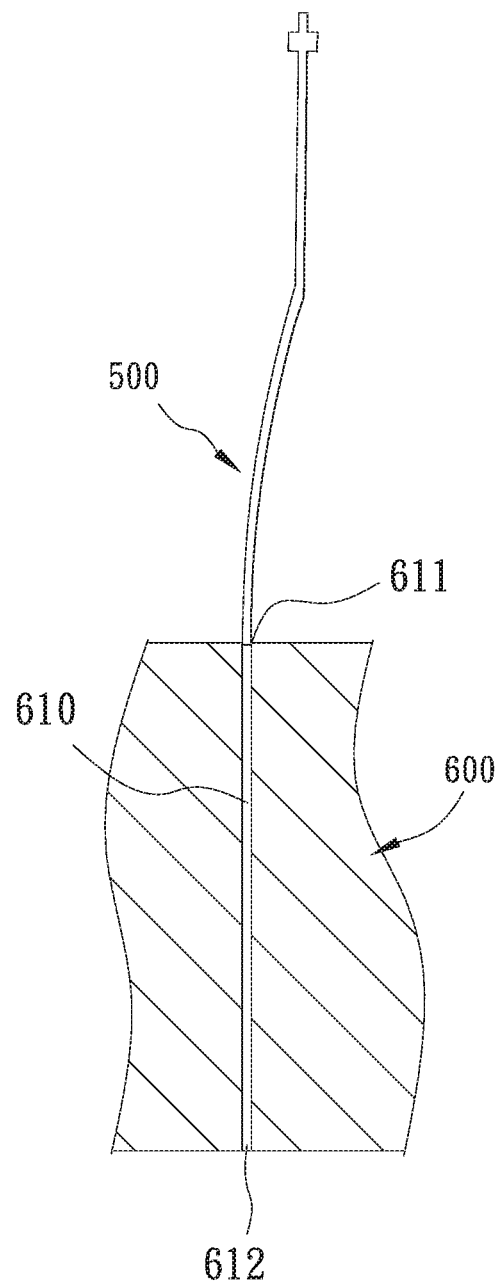
FIG. 6 is a cross sectional view showing the assembly of a holding tray and a material of the precise assembly mechanism according to the preferred embodiment of the present invention.

The visual sensing unit 400 includes multiple sensors, such as four sensors. With reference to FIG. 6, a first sensor 50 is configured to identify a position of an upper rim 611 of each through orifice 610 of the holding tray 600, a second sensor 60 is located below the rail set 41 and emits an optical path via the opening 421 so as to identify positions of a lower rim 612 of each through orifice 610 and a tip of each material 500. Referring further to FIG. 3, a third sensor 70 emits an optical path parallel to the second direction Y via a first reflector 71 so as to determine a profile of each material 500. As shown in FIG. 2, a fourth sensor 80 emits an optical path parallel to the first direction X via a second reflector 81 so as to judge the profile of each material 500.

When the clamper 11 clamps each material 500, the first sensor 50 and the second sensor 60 identify the positions of the upper rim 611 and the lower rim 612 of each through orifice 610, and when the positions of the upper rim 611 and the lower rim 612 of each through orifice 610 are not correct, the slider 40 of the loading unit 300 adjusts the holding tray 600 to an accurate position in the first direction X and the second direction Y. Thereafter, the third sensor 70 and the fourth sensor 80 identify the profile of each material 500, when the control unit 100 judges the profile of each material 500 offsets a set value, the first motor 20 is started by the control unit 100 so as to drive the damper 11 and each material 500 to rotate the first angle $\theta_X$ (as shown in FIG. 4) in the first direction X. Alternatively, the second motor 30 is started by the control unit 100 so as to drive the clamper 11 and each material 500 to rotate the second angle $\theta_y$ (as shown in FIG. 5) in the second direction Y. When the third sensor 70 and the fourth sensor 80 confirm the profile of each material 500 is at the set value, and the second sensor 60 confirms the position of the tip of each material 500 is correct, the pick module 10 inserts each material 500 into each through orifice 610 of the holding tray 600. Due to profiles of the materials 500 are not identical, the third sensor 70 and the fourth sensor 80 judge the profiles of the multiple materials 500, and the pick module 10 adjusts the multiple materials 500 to accurate angles by matching with the first motor 20 and the second motor 30, hence the multiple materials 500 are inserted into the at least one through orifice 610 exactly.

Accordingly, the multiple materials 500 (such as probes of chips) are inserted into the at least one through orifice 610 accurately and quickly by way of the precise assembly mechanism. The visual sensing unit 400 adjusts a position of each through orifice 610, judges the profile of each material 500, and aligns the tip of each material 500 with the each through orifice 610. Preferably, the first motor 20 and the second motor 30 of the clamp unit 200 drive the pick module 10 to adjust the profile of each material 500, thus inserting each material 500 into each through orifice 610 quickly and reducing fabrication cost.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A precise assembly mechanism being applied to assemble multiple materials onto a holding tray having at least one through orifice, and the precise assembly mechanism comprising:
    a control unit controlling a clamp unit, a loading unit, and a visual sensing unit to operate;
    the clamp unit including a clamper configured to clamp the multiple materials and moveable in a third direction Z;
    the loading unit located below the clamp unit and including a slider moveable in a first direction X or a second direction Y perpendicular to the first direction X, the holding tray being mounted on the slider so as to be controlled by the slider to move in the first direction X or the second direction Y;
    the visual sensing unit including multiple sensors, wherein a first sensor is configured to identify a position of an upper rim of each of the at least one through orifice of the holding tray, a second sensor is configured to identify positions of a lower rim of each through orifice and a tip of each of the multiple materials, a third sensor is configured to determine a profile of each material in the second direction Y, and a fourth sensor is configured to judge the profile of each material in the first direction X;
    when the first sensor and the second sensor respectively confirm positions of the upper rim and the lower rim of each through orifice, the third sensor and the fourth sensor confirm the profile of each material is at a set value, and the second sensor confirms the position of the tip of each material is correct, the clamper inserts each material into each through orifice of the holding tray.

2. The precise assembly mechanism as claimed in claim 1, wherein the clamp unit further includes a first motor and a second motor, the first motor is fixed on a first side of the clamper and controls the clamper and each of the multiple materials to rotate in the first direction X, and the second motor is secured on a second side of the clamper and controls the clamper and each material to rotate in a second direction Y.

3. The precise assembly mechanism as claimed in claim 2, wherein the third sensor includes a first reflector mounted on a bottom thereof so as to reflect an optical path of the third sensor to the second direction and to determine the profile of each material, and when the third sensor judges the profile of each material offsets the set value, the second motor is started to drive the clamper and each material to rotate in the second direction Y.

4. The precise assembly mechanism as claimed in claim 2, wherein the fourth sensor includes a second reflector mounted on a bottom thereof so as to reflect an optical path of the fourth sensor to the first direction and to determine the profile of each material, and when the fourth sensor judges the profile of each material offsets the set value, the first motor is started to drive the clamper and each material to rotate in the first direction X.

5. The precise assembly mechanism as claimed in claim 2, wherein the first motor has a first central shaft axially connected on the first side of the clamper so as to control the clamper and each material to rotate in the first direction X.

6. The precise assembly mechanism as claimed in claim 2, wherein the second motor has a second central shaft axially connected on a drive member which is in connection with the clamper so as to control the clamper and each material to rotate in the second direction Y.

7. The precise assembly mechanism as claimed in claim 2, wherein the first motor of the clamp unit is a servo motor or a stepper motor.

8. The precise assembly mechanism as claimed in claim 2, wherein the second motor of the clamp unit is a servo motor or a stepper motor.

9. The precise assembly mechanism as claimed in claim 1, wherein the slider has a rail set and a platform arranged on the rail set, and the platform has an opening defined on a central position thereof, wherein the holding tray is located above the opening of the platform, and the second sensor is located below the rail set so as to emit an optical path via the opening and to identify a position of the lower rim of each through orifice.

* * * * *